United States Patent
Li et al.

(10) Patent No.: US 6,660,636 B1
(45) Date of Patent: Dec. 9, 2003

(54) HIGHLY SELECTIVE AND COMPLETE INTERCONNECT METAL LINE AND VIA/CONTACT HOLE FILLING BY ELECTROLESS PLATING

(75) Inventors: Sam Fong Yau Li, Singapore (SG); Hou Tee Ng, Singapore (SG)

(73) Assignee: The National University of Singapore, Singapore (SG)

( * ) Notice: Subject to any disclaimer, the term of this patent is extended or adjusted under 35 U.S.C. 154(b) by 0 days.

(21) Appl. No.: 09/743,675

(22) PCT Filed: Jul. 14, 1999

(86) PCT No.: PCT/SG99/00076

§ 371 (c)(1),
(2), (4) Date: Mar. 9, 2001

(87) PCT Pub. No.: WO00/04573

PCT Pub. Date: Jan. 27, 2000

(30) Foreign Application Priority Data

Jul. 16, 1998 (SG) .............................................. 9801811

(51) Int. Cl.$^7$ ............................................ H01L 21/302
(52) U.S. Cl. ........................ 438/690; 438/691; 438/692; 438/693; 438/700; 438/745
(58) Field of Search ........................ 438/700, 690–693, 438/745

(56) References Cited

U.S. PATENT DOCUMENTS

| | | | |
|---|---|---|---|
| 5,595,943 A | 1/1997 | Itabashi et al. | |
| 5,674,787 A | 10/1997 | Zhao et al. | |
| 5,705,430 A | 1/1998 | Avanzino et al. | |
| 5,747,360 A | 5/1998 | Nulman | |
| 6,184,138 B1 * | 2/2001 | Ho et al. | 438/687 |
| 6,268,289 B1 * | 7/2001 | Chowdhury et al. | 438/687 |
| 6,387,800 B1 * | 5/2002 | Liu et al. | 438/653 |

FOREIGN PATENT DOCUMENTS

| | | |
|---|---|---|
| EP | 0725439 A2 | 8/1996 |
| EP | A2725439 | 8/1996 |

OTHER PUBLICATIONS

Wolf et al. "Silicon Processing for the VLSI Era", vol. 1, pp. 175–176.*

Diamond et al., *Microelectronic Engineering, High aspect ratio quarter–micron electroless copper integrated technology*, vol. 34, pp77–88, (Nov. 1997).

S. Lakshiminarayanan et al., *IEEE Electron Device Letters, Contact and via structures with copper interconnects fabricated using dual Damascene technology*, vol. 15, No. 8, pp307–309, (Aug. 1994).

C. Marcadal et al., *European Workshop.Materials for Advanced Metallization. MAM'97, OMCVD TiN diffusion barrier for chopper contact and via/interconnects structures*, Abstracts Booklet (IEEE Cat. No 97$^{th}$8287), pp54–55, Paris, France, (1997).

Diamand et al., In: Microelectronic Engineering, vol. 37, pp. 77–88 (1997).

Lakshiminarayanan et al., In: IEEE Electron Device Letters, vol. 15, no. 9, pp. 307–309 (1994).

Marcadal et al., In: European Workshop, Materias for Advanced Metallization, pp. 54–55 (1997).

* cited by examiner

Primary Examiner—Felisa Hiteshew
(74) Attorney, Agent, or Firm—Birch, Stewart, Kolasch & Birch LLP

(57) ABSTRACT

A novel method for the activation of semiconductor substrates for highly selective electroless copper plating in multilayer interconnect metallization lines and vias/contact holes has been developed. A copper-seeded polysilicon layer is provided over the substrate to facilitate growth of copper into the vias. Subsequent rinsing and chemical-mechanical polishing processes allow removal of overgrowth of copper and the polysilicon layer to achieve overall smooth topography of the copper surface and the insulating layer surface of the substrate.

10 Claims, 4 Drawing Sheets

HIGHLY SELECTIVE AND COMPLETE INTERCONNECT METAL LINE AND VIA/CONTACT HOLE FILLING BY ELECTROLESS PLATING

This application is the national phase under 35 U.S.C. §371 of PCT International Application No. PCT/SG99/00076 which has an International filing date of Jul. 14, 1999, which designated the United States of America.

BACKGROUND OF THE INVENTION FIELD OF THE INVENTION

1. Field of the Invention

This invention relates to a method of fabrication used for semiconductor integrated circuit devices and more specifically to a method of activation prior to electroless copper plating for achieving highly selective complete interconnect metal line and via/contact hole fill.

2. Description of Related Art

As semiconductor integrated circuits are constantly being scaled down to the deep submicron regime, multiple layers of interconnections are thus required so as to meet the increase in the packing density. Vias/contact holes between successive layers of interconnections have had to have almost near vertical sidewalls with high aspect ratios and have had to be placed at smaller spacing intervals to fulfill such requirement. Subsequent metallization processes are thus necessary to fill the vias/contact holes completely without voids with high conductivity metal such as copper.

Various techniques of deposition of copper have been known which, in general, include electroplating, electroless plating, sputtered chemical and physical vapor deposition. Among these, the electroless method appears preferable based on considerations like the cost of the fabrication process, the ease of execution of the process and the complete filling capability of the process. However, in general, prior to such electroless plating, an adhesive/catalytic seeding layer like Pd or CVD (Chemical Vapor Deposition) Cu has had to be laid down to facilitate subsequent plating and high selectivity of the plating is very much desired such that a majority of the plated Cu is deposited in the interconnect metal lines and the vias/contact holes.

In U.S. Pat. No. 5,167,992 (issued to Charles W. C. Lin et al on Dec. 1, 1992), a selective electroless plating for metal conductors disposed on a dielectric surface is disclosed. The method includes removing a carbonized film from the dielectric surface by a plasma discharge, acid treating the metal conductor in a first acid solution, activating the metal conductor, and deactivating the dielectric surface in a second acid solution, followed by electroless plating to overcoat a metal on the metal conductor only.

Also, in U.S. Pat. No. 5,017,516 (granted to Andreas M. T. P. van der Putten), a method of performing electroless plating selectively in contact holes through selective nucleations using a low concentration of $PdCl_2$ is disclosed.

U.S. Pat. No. 5,443,865 entitled "Method for Conditioning a Substrate for Subsequent Electroless Metal Deposition" (issued to Tisdale, et al on Aug. 22, 1995), discloses a method whereby electrochemically generated reducing agents are adsorbed by a substrate which is then in contact with a seeding medium to deposit Palladium seed for subsequent electroless and electrolytic metallization.

U.S. Pat. No. 4,869,930 entitled "Method for Preparing Substrates for Deposition of Metal Seed from An Organometallic Vapor for Subsequent Blectroless Metallization" (granted to Clarke, et al on Sep. 26, 1989) describes a process whereby a volatile organometallic compound is allowed to react with active chemical sites initially adsorbed on a substrate to form a species of the metal constituent of the compound which may then be transformed into a free metal to serve as a seed for subsequent electroless deposition. When selective deposition is desired, a resist masking layer is used prior to forming the seed layer.

U.S. Pat. No. 5,674,787 entitled "Selective Electroless Copper Deposited Interconnect Plugs for USLI Applications" discloses a method utilising electroless copper deposition to selectively form encapsulated copper plugs in vias of a semiconductor, to connect conductive regions on the semiconductor.

With the above prior art techniques, growth of plugs has been achieved by activation of a surface of a barrier material in a base of the vias followed by electroless deposition of metal on the activated surface. In the case of U.S. Pat. No. 5,674,787 the barrier material is a diffusion barrier material such as titanium nitride (TiN) and the deposited metal is copper. In order to activate the TiN the semiconductor is treated in an activation solution which includes a surfactant to facilitate seeding of Cu on the TiN. Use of a surfactant such as polyethylene glycol or Triton X-100 can, however, introduce hydrocarbons into the vias which may effect reliable operation of the plug.

SUMMARY OF THE INVENTION

It is an object of the invention to provide a new method of forming plugs in a via/contact hole in a semiconductor without requiring selective activation of a barrier surface in a base of the hole.

In accordance with the invention there is provided a method of fabrication for a semiconductor integrated circuit device, including:

providing a semiconductor substrate having an insulating layer with a contact hole formed therein and a diffusion barrier provided on sidewalls and a base of the hole;

forming a film of polysilicon on a surface of the substrate in which the hole is provided;

subjecting the said substrate to an activation aqueous solution;

forming an activation layer comprising copper seedings on the said polysilicon;

rinsing said semiconductor substrate to remove said aqueous solution;

depositing copper on the activation layer by electroless copper deposition such the copper forms into said hole to fill the contact hole and thereby provide a plug without voids;

rinsing said semiconductor substrate; and applying chemical-mechanical polishing to remove said polysilicon and excess copper external of said hole to thereby provide the substrate with a smooth topography.

BRIEF DESCRIPTION OF THE DRAWINGS

The invention is more fully described, by way of non-limiting example only, with reference to the drawings, in which.

DETAILED DESCRIPTION OF THE PREFERRED EMBODIMENT

Figure 1A:
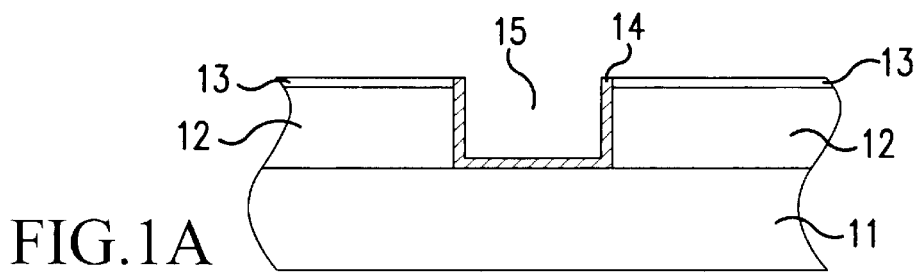
FIGS. 1A–1E are cross-sectional schematic representations illustrating the method of one embodiment of the present invention.
Figure 1B:
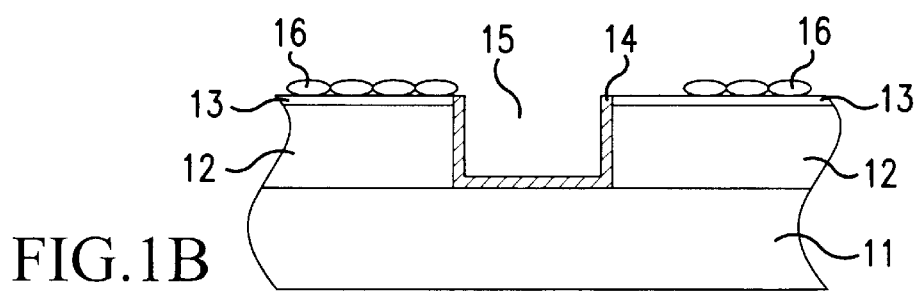
Figure 1C:
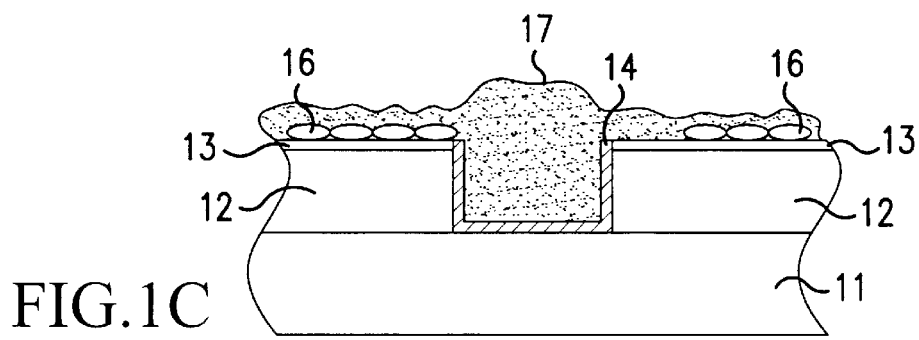
Figure 1D:
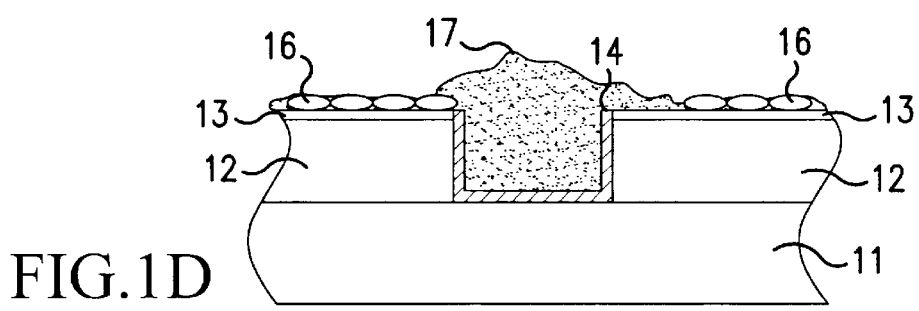
Figure 1E:
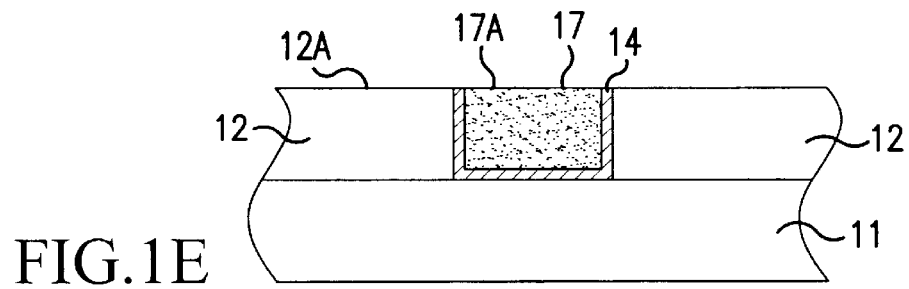
Figure 2A:
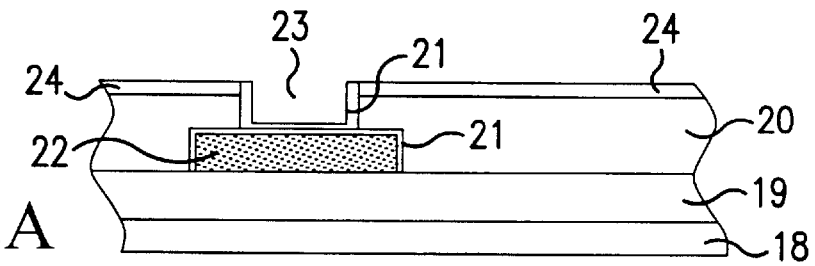
FIGS. 2A–2E are cross-sectional schematic representations illustrating the method of a second embodiment of the present invention.
Figure 2B:
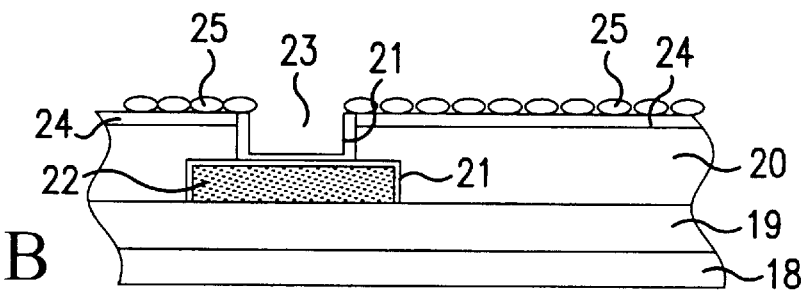
Figure 2C:
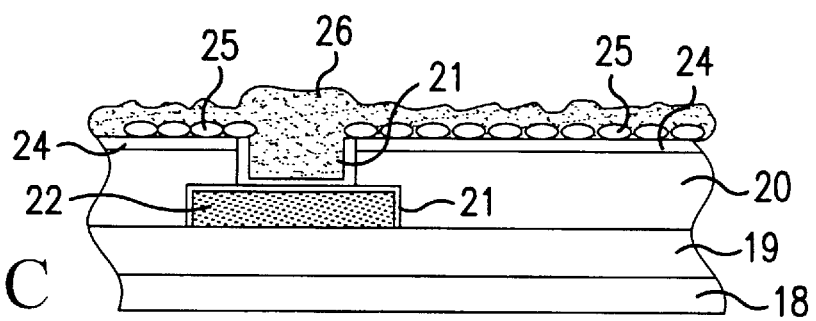
Figure 2D:
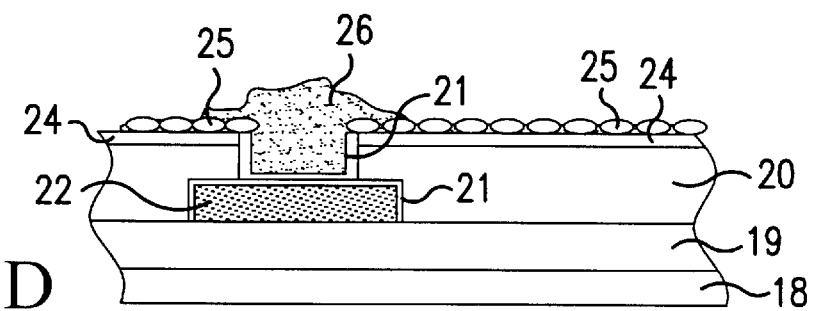
Figure 2E:
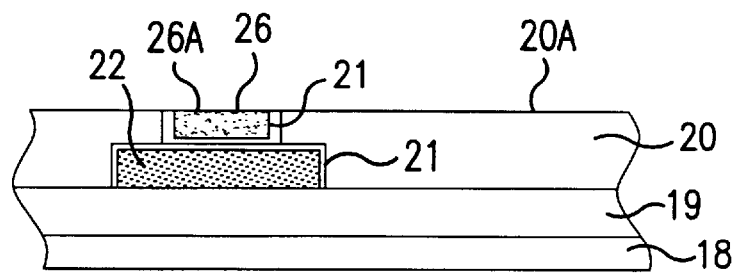
Figure 3A:
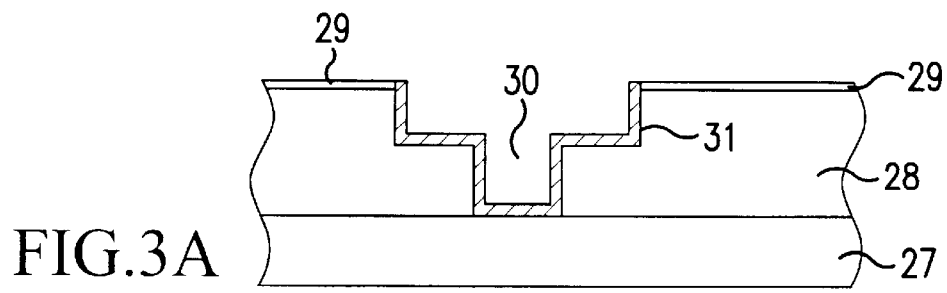
FIGS. 3A–3E are cross-sectional schematic representations illustrating the method of a third embodiment of the present invention.
Figure 3B:
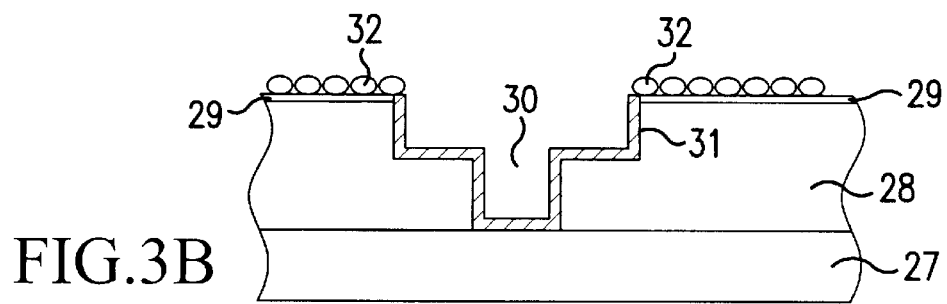
Figure 3C:
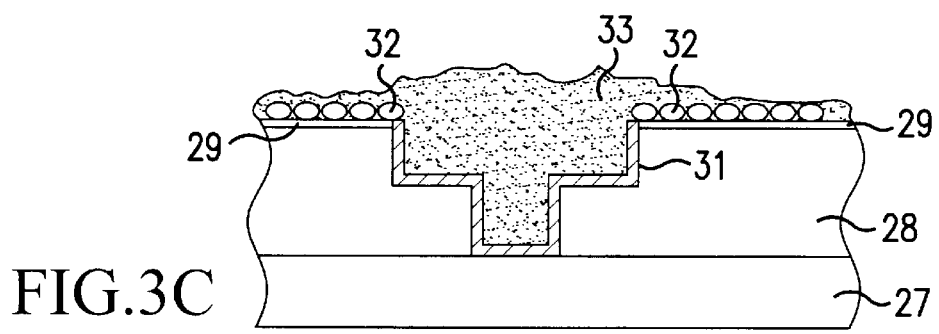
Figure 3D:
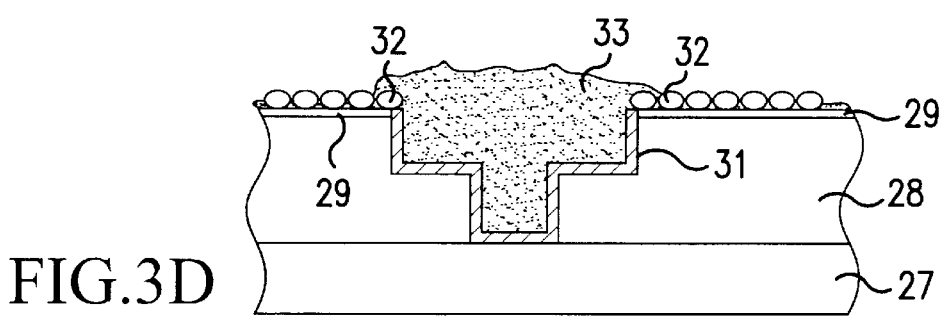
Figure 3E:
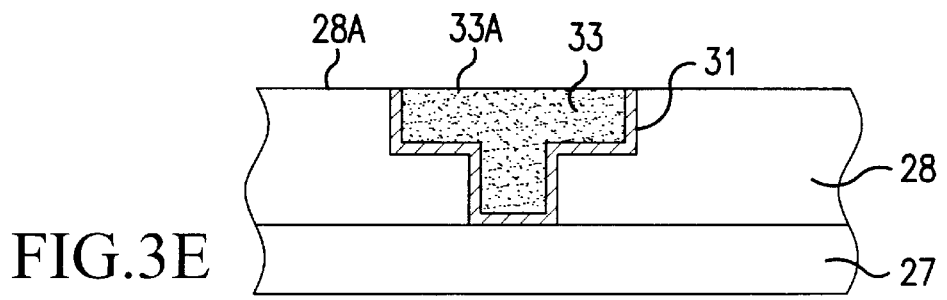
Figure 4A:
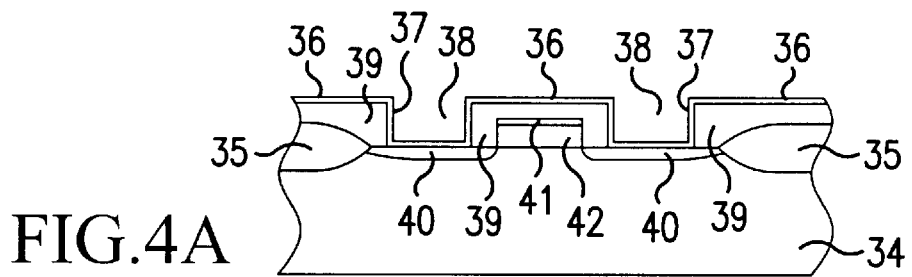
FIGS. 4A–4E are cross-sectional schematic representations illustrating the method of a fourth embodiment of the present invention.
Figure 4B:
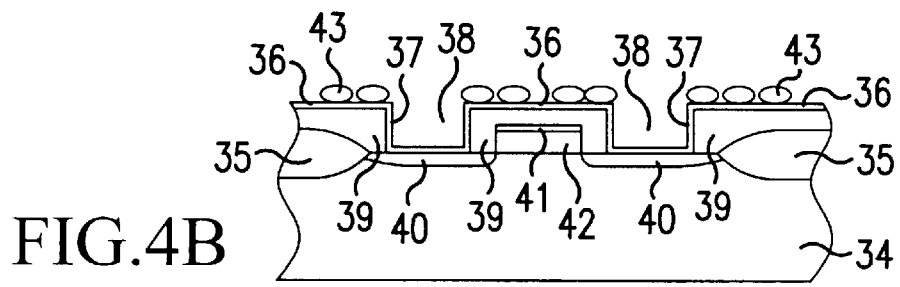
Figure 4C:
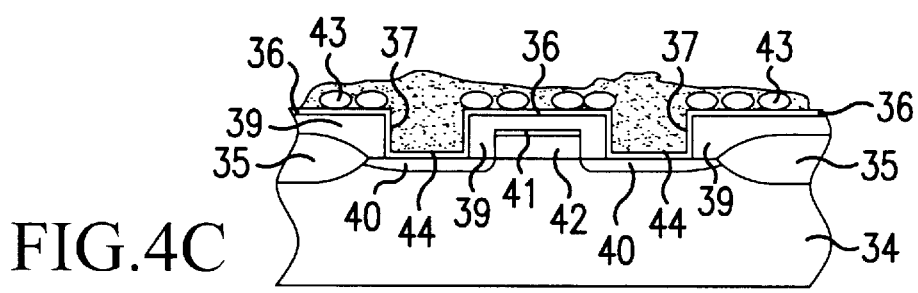
Figure 4D:
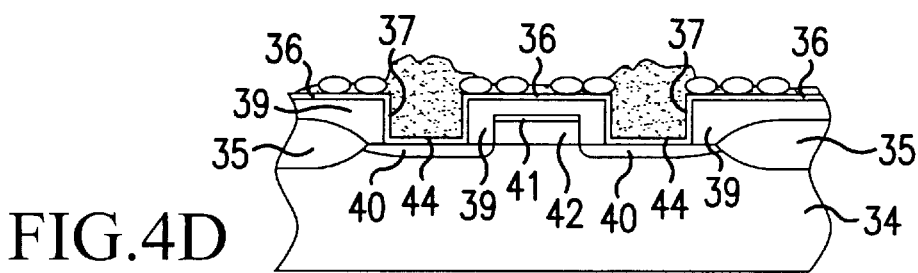
Figure 4E:
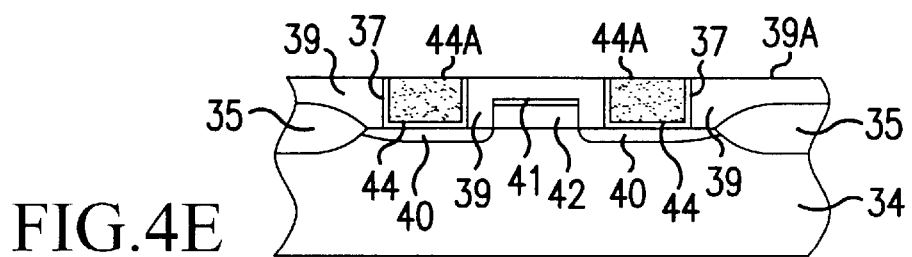

Referring to FIGS. 1A–1B, the semiconductor substrate 11 may be p- or n-type single crystal silicon, but is not limited thereto. An insulating layer 12 may be a high dielectric material like silicon dioxide ($SiO_2$), BPTEOS, spin-on-glass (SOC) and SABPSG having a thickness of between about 4000 and 12000 angstroms. A physical vapour deposition (PVD) or chemical vapour deposition (CVD) polysilicon 13 with thickness in the range of 500 and 1000 angstroms may be formed on the insulating layer. Contact holes/vias 15 having a width between about 3500 and 5000 angstroms may be formed in the dielectric insulating layers by conventional plasma etching processes and reactive ion etching (RIE) to reach the silicon substrate. A difflusion barrier 14 may be Titanium nitride (TiN), Tungsten nitride (WN) and Tantalum nitride (TaN) deposited by sputtered, collimated, CVD, MOCVD, PVD and IMP techniques. The polysilicon layer is preferably doped with Boron, Arsenic or P+ and the dopant concentration is at least $1E15\ cm^{-3}$ so that the layer has some degree of conductivity to facilitate plating of, for example, TiN. An activation approach using an aqueous solution containing HF of concentration between about 1% and 10% and Cu of concentration between about 100 ppm and 500 ppm at a temperature between about 25 and 80° C. may be used to outplate copper 16 on the polysilicon 13 by immersing the semiconductor substrate and surface layers (11–15) into the above-mentioned aqueous solution for a duration of between about 15 and 60 s and followed by subsequent thorough rinsing with ultrapure water. Next, copper 17 is deposited on previously deposited copper 16 and in the contact hole/vias 15 by electroless plating from a solution comprising of a cupric ion source (eg. $CuSO_4.5H_2O$), a reducing agent (eg. HCHO, DMAB), a complexing agent (eg. BDTA), a pH adjuster (eg. TMAH), a surfactant (eg. polyethylene glycol) and additives (eg. KCN, TEAC) at a temperature between about 25 and 80° C. Electroless Cu plating is continued for a duration sufficiently long such that an overgrowth of copper of between about 500 and 2000 angstroms above the surface plane of the contact hole/via is obtained. Subsequent rinsing with ultrapure water, which preferably has a resistivity of about $18.2\ M\Omega cm^{-1}$, results in peeling off of Cu deposits from top of the insulating layer 12 only, thus allowing highly selective deposition in the via/contact hole. Finally, a CMP (Chemical-Mechanical-Polishing) process, which uses a polishing slurry comprising of alumina, ultrapure water and sulfuric acid in the pH range of between about 2 and 3, is performed to remove the excess copper 17 over the contact hole/ via and the polysilicon 13 to obtain coplanar topography of the copper surface 17A and the insulating layer surface 12A. Complete removal of the polysilicon layer ensures there is no electrical connection between the individual filled holes.

Referring to FIGS. 2A–2E, a second embodiment of the invention is illustrated, wherein a contact hole in contact with a multilayer metallization pattern is completely filled without voids with copper 26 using the activation method of the present invention. The semiconductor substrate 18 may be p- or n-type single crystal silicon. The insulating layer 19 may be a high dielectric material like silicon dioxide ($SiO_2$), BPTBOS, spin-on-glass (SOC) and SABPSG having a thickness of between about 4000 and 12000 angstroms. A metallization pattern 22, with diffusion barrier layer 21, is formed in the insulating layer 20 by conventional integrated circuit processes. A PVD or CVD polysilicon 24 with thickness in the range of between about 500 and 1000 angstroms is formed on the insulating layer 20. The polysilicon layer may be doped, as described with reference to the first embodiment. Contact hole 23 is formed in the insulating layer 20 by conventional reactive ion etching (RIB) or plasma etching to reach the multilayer metallization pattern 22. An activation approach using an aqueous solution containing HF of concentration between about 1% and 10% and Cu of concentration between about 100 ppm and 500 ppm at a temperature between about 25 and 80° C. may be used to outplate copper 25 on the polysilicon 24 by immersing the semiconductor substrate and surface layers (18 and 24) into the above-mentioned aqueous solution for a duration of between about 15 and 60 s and followed by subsequent thorough rinsing with ultrapure water. Next, copper 26 is deposited on 25 and in the contact hole/via 23 by electroless plating from a solution comprising of a cupric ion source (eg. $CuSO_4.5H_2O$), a reducing agent (eg. HCHO, DMAB), a complexing agent (eg. BDTA), a pH adjuster (eg. TMAH), a surfactant (eg. polyethylene glycol) and additives (eg. KCN, TBAC) at a temperature between about 25 and 80° C. Electroless Cu plating is continued for a duration sufficiently long such that an overgrowth of copper of between about 500 and 2000 angstroms above the contact hole/via is preferred. Subsequent rinsing with ultrapure water results in peeling off of Cu deposits from top of the polysilicon 24 only, thus allowing highly selective deposition in the vias/contact holes. Finally, a CMP (Chemical-Mechanical-Polishing) process, which uses a polishing slurry comprising of alumina, ultrapure water and sulfuric acid in the pH range of between about 2 and 3, is performed to remove the excess copper 26 over the contact hole/via and to completely remove the polysilicon 24 to obtain coplanar topography of the copper surface 26A and the insulating layer surface 20A.

Referring to FIGS. 3A–3E, a third embodiment of the present invention is demonstrated, wherein a dual damascene structure 30 is completely filled without voids with copper 33 using the activation method of the present invention. The semiconductor substrate 27 may be p- or n-type single crystal silicon. The insulating layer 28 may be a high dielectric material like silicon dioxide ($SiO_2$), BPTEOS, spin-on-glass (SOG) and SABPSG having a thickness of between about 4000 and 12000 angstroms deposited on the semiconductor substrate 27. The diffusion barrier 31 may be Titanium nitride (TiN), Tungsten nitride (WN) and Tantalum nitride (TaN) deposited by sputtered, collimated, CVD, MOCVD, PVD and IMP techniques. The PVD or CVD polysilicon 29 with thickness in the range of 500 and 1000 angstroms is formed on the insulating layer 28, preferably with dopants as referred in above. An activation approach using an aqueous solution containing HF of concentration between about 1% and 10% and Cu of concentration between about 100 ppm and 500 ppm at a temperature between about 25 and 80° C. may be used to outplate copper 32 on the polysilicon 29 by immersing the semiconductor substrate and surface layers (27–32) into the above-mentioned aqueous solution for a duration of between about 15 and 60 s and followed by subsequent thorough rinsing with ultrapure water. Next, copper 33 is deposited on 32 and in the dual damascene structure 30 by electroless plating from a solution comprising of a cupric ion source (eg. $CuSO_4.5H_2O$), a reducing agent (eg. HCHO, DMAB), a complexing agent (eg. BDTA), a pH adjuster (eg. TMAH), a surfactant (eg. polyethylene glycol) and additives (eg. KCN, TEAC) at a temperature between about 25 and 800° C. Electroless Cu plating is continued for a duration sufficiently long such that an overgrowth of copper of between about 500 and 2000 angstroms above the dual damascene structure is obtained. Subsequent rinsing with ultrapure water results in peeling off of Cu deposits from top of the polysilicon 29 only, thus allowing highly selective deposition to occur. Finally, a CMP (Chemical-Mechanical-Polishing) process, which uses a polishing slurry comprising of alumina, ultrapure water and sulfuric acid in the pH range of between about 2 and 3, is performed to remove the excess copper 33 over the dual damascene structure and the polysilicon 29 to obtain coplanar topography of the copper surface 33A and the insulating layer surface 28A.

Referring to FIGS. 4A–4E, a fourth embodiment of the present invention is illustrated, wherein a via in contact to the active regions of an integrated circuit transistor like a MOSFET is completely filled without voids with copper using the activation method of the present invention. A device with gate oxide 42, polysilicon 41, source and drain regions 40 is built on the semiconductor substrate 34 by conventional processes and is surrounded by a thick field oxide region 35. Contact holes 38 are formed in the insulating layer 39 by conventional plasma etching and reactive ion etching. The insulating layer 39 may be a high dielectric material like silicon dioxide ($SiO_2$), BPTEOS, spin-on-glass (SOC) and SABPSG having a thickness of between about 4000 and 12000 angstroms deposited on the semiconductor substrate 34. The diffusion barrier 37 may be Titanium nitride (TiN), Tungsten nitride (WN) and Tantalum nitride (TaN) deposited by sputtered, collimated, CVD, MOCVD, PVD and IMP techniques. The PVD or CVD polysilicon 36 with thickness in the range of between about 500 and 1000 angstroms, preferably with dopants as described above, is formed on the insulating layer 39. An activation approach using an aqueous solution containing HF of concentration between about 1% and 10% and Cu of concentration between about 100 ppm and 500 ppm at a temperature between about 25 and 80° C. may be used to outplate copper 43 on the polysilicon 36 by immersing the semiconductor substrate and surface layers (34–38) into the above-mentioned aqueous solution for a duration of between about 15 and 60 s and followed by subsequent thorough rinsing with ultrapure water. Next, copper 44 is deposited on 43 and in the contact holes 38 by electroless plating from a solution comprising of a cupric ion source (eg. $CuSO_4.5H_2O$), a reducing agent (eg. HCHO, DMAB), a complexing agent (eg. BDTA), a pH adjuster (eg. TMAH), a surfactant (eg. polyethylene glycol) and additives (eg. KCN, TEAC) at a temperature between about 25 and 80° C. Electroless Cu plating is continued for a duration sufficiently long such that an overgrowth of copper of between about 500 and 2000 angstroms above the contact holes is preferred. Subsequent rinsing with ultrapure water results in peeling off of Cu deposits from top of the polysilicon 36 only, thus allowing highly selective deposition to occur. Finally, a CMP (Chemical-Mechanical-Polishing) process, which uses a polishing slurry comprising of alumina, ultrapure water and sulfuric acid in the pH range of between about 2 and 3, is performed to remove the excess copper 44 over the contact holes and the polysilicon 36 to obtain coplanar topography of the copper surface 44A and the insulating layer surface 39A.

As can be appreciated the invention provides for convenient and reliable formation of plugs in a semiconductor substrate, without the more complicated prior art techniques of selectively seeding only a base of the vias and the use of a surfactant in the activation solution, thereby simplifying fabrication and minimising the level of hydrocarbon contamination in the vias.

While the invention has been particularly shown and described with respect to the preferred embodiments set forth above, it will be understood by those skilled in the art that the foregoing and other changes in form and details may be made therein without departing from the spirit and the scope of the invention.

What is claimed is:

1. A method of fabrication for a semiconductor integrated circuit device, including:

provind a semiconductor substrate having an insulating layer with a contact hole formed therein and a diffusion barrier provided on and limited to sidewalls and a base of the hole;

forming a film of polysilicon on and limited to a surface of the substrate in which the hole is provided;

subjecting the said substrate to an activation aqueous solution;

forming an activation layer comprising copper seedings on the said polysilicon;

rinsing said semiconductor substrate to remove said aqueous solution;

depositing copper on the activation layer by electroless copper deposition such that the copper forms into said hole to fill the contact hole and thereby provide a plug without voids;

rinsing said semiconductor substrate; and applying chemical-mechanical polishing to remove said polysilicon and excess copper external of said hole to thereby provide the substrate with a smooth topography.

2. The method of claim 1, wherein said activation aqueous solution comprises HF of concentration between about 1 and 10% and copper of concentration between about 100 ppm and 500 ppm and the activation layer is formed at a temperature between about 25 and 70° C.

3. The method of claim 1, wherein said semiconductor substrate is rinsed with ultrapure water having resistivity, of substantially 18.2 $M\Omega cm^{-1}$.

4. The method of claim 1, wherein said copper is deposited by said electroless copper deposition from an aqueous solution including a cupric ion source, a reducing agent, a complexing agent, a pH adjuster, a surfactant and additives, at a temperature of between about 25 and 90° C.

5. The method of claim 1, wherein said semiconductor substrate is rinsed after said electroless copper deposition to remove copper deposits from said polysilicon.

6. The method of claim 1, wherein the electroless copper deposition results in formation of copper above an opening of said hole to a height of between about 200 and 3000 angstroms.

7. The method of claim 1, wherein the chemical-mechanical polishing utilises a polishing slurry comprising alumina, ultrapure water and sulfuric acid in the pH range of between about 2 and 3.

8. The method as claimed in claim 1, wherein the plug is formed so as to contact multilayer interconnect metallisation patterns on the semiconductor substrate.

9. The method as claimed in claim 1, wherein the substrate includes an integrated circuit dual damascene structure with at least two contact holes and the method results in both holes being filled with copper plugs.

10. The method as claimed in claim 1, wherein the plug is provided in contact with active regions of the device.

* * * * *